(12) United States Patent
Shao et al.

(10) Patent No.: US 8,466,737 B2
(45) Date of Patent: Jun. 18, 2013

(54) CHARGE PUMP DEVICE

(75) Inventors: Chi Yi Shao, Taichung (TW); Paul C.-P. Chao, New Taipei (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/370,589

(22) Filed: Feb. 10, 2012

(65) Prior Publication Data

US 2012/0262224 A1    Oct. 18, 2012

(30) Foreign Application Priority Data

Apr. 15, 2011 (TW) .............................. 100113248 A

(51) Int. Cl.
*G05F 1/10* (2006.01)
(52) U.S. Cl.
USPC ........................................................ 327/536
(58) Field of Classification Search
USPC ................. 327/530, 534–537, 538, 540, 541, 327/543
See application file for complete search history.

(56) References Cited

U.S. PATENT DOCUMENTS

| 6,285,241 B1 * | 9/2001 | Yoshida ........................ 327/536 |
| 2009/0160532 A1 | 6/2009 | Wu et al. |
| 2010/0085786 A1 | 4/2010 | Chiu et al. |
| 2010/0117719 A1 | 5/2010 | Matano |

OTHER PUBLICATIONS

Wu, et al., "MOS Charge Pumps for Low-Voltage Operation", IEEE Journal of Solid-State Circuits, vol. 33, No. 4, Apr. 1998, pp. 592-597.
Ker, et al., "Design of Charge Pump Circuit With Consideration of Gate-Oxide Reliability in Low-Voltage CMOS Processes", IEEE Journal of Solid-State Circuits, vol. 41, No. 5, May 2006, pp. 1100-1107.

* cited by examiner

*Primary Examiner* — Lincoln Donovan
*Assistant Examiner* — Sibin Chen
(74) *Attorney, Agent, or Firm* — Muncy, Geissler, Olds & Lowe, PLLC

(57) ABSTRACT

A charge pump device is coupled to first and second input terminals receiving an AC signal and comprises an electric switch set and two voltage boost circuits. The electric switch set is coupled to the first and second input terminals and a ground terminal and switches the conduction status thereof according to the AC signal. The two voltage boost circuits are interconnected and coupled to the first and second input terminals and the electric switch set. The boost circuits receive the AC signal according to the conduction status, respectively boost voltage in positive and negative semi-periods of the AC signal, and alternatively output a voltage at least two times the peak voltage of the AC signal, to a load. The present invention not only boosts voltage by several folds within a cycle but also outputs voltage by dual phases to reduce ripple of output voltage.

11 Claims, 6 Drawing Sheets

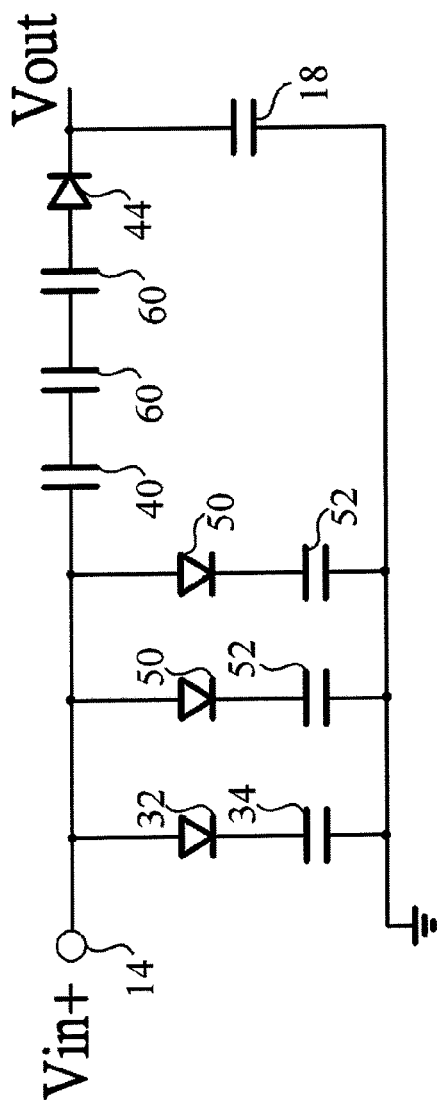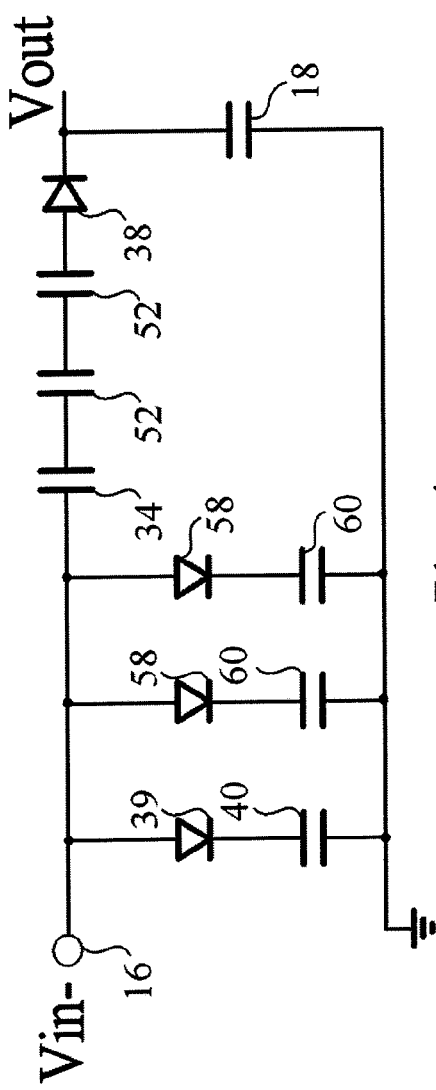
Fig. 3
Fig. 4

US 8,466,737 B2

CHARGE PUMP DEVICE

BACKGROUND OF THE INVENTION

1. Field of the Invention

The present invention relates to a pump device, particularly to a charge pump device.

2. Description of the Related Art

An electronic device normally needs different levels of source voltages. Thus, an electronic device is usually equipped with charge pump devices so as to harness the existing source voltage to generate different levels of source voltages. For example, a flash cell needs different bias voltages in reading, writing (or programming) and erasing. In order to save power, the current electronic devices normally adopt an external source voltage of 3.3V or less. Therefore, charge pump circuits are used to boost voltage so as to supply the required bias voltages of such as 5V, 7V, 9V and 10V to a flash memory.

Refer to FIG. 1. A conventional charge pump device normally comprises a plurality of diodes 10 and a plurality of capacitors 12, whereby to boost or multiply voltage. In such a circuit, two signals having opposite-phase clocks are used to charge or discharge the capacitors 12 so as to boost voltage. If there are N pieces of capacitors 12, the charge pump circuit must spend a time of N periods long for N-fold voltage boosting. In other words, such a circuit takes a pretty long time to boost the voltage to the desire value. Besides, as the conventional charge pump device needs two signals having opposite-phase clocks, the signals thereof should be very accurate lest the circuit be unstable in voltage transition between low level and high level.

Accordingly, the present invention proposes a charge pump device to solve the abovementioned problems.

SUMMARY OF THE INVENTION

The primary objective of the present invention is to provide a charge pump device, wherein two identical voltage boost circuits alternately output signals within a period to greatly raise voltage and reduce ripple of the output voltage.

Another objective of the present invention is to provide a charge pump device, which does not use two signals of opposite-phase clocks but only needs a single signal, wherefore is solved the problem of clock control.

To achieve the abovementioned objectives, the present invention proposes a charge pump device, which connects with a first input terminal, a second input terminal and a load, wherein the first and second input terminals receive an AC signal. The charge pump device of the present invention comprises an electronic switch set and two interconnected voltage boost circuits. The electronic switch set connects with the first input terminal, the second input terminal and a ground terminal and switches the conduction status thereof according to the AC signal. The two voltage boost circuits connect with the first and second input terminals, the electronic switch set and the load. The two voltage boost circuits receive the AC signal according to the conduction status of the electronic switch set, respectively boost the voltage of the AC signal in the positive semi-period and the negative semi-period, and alternately output to the load a voltage at least two times the peak voltage of the AC signal.

Below, embodiments are described in detail in cooperation with the attached drawings to make easily understood the characteristics, technical contents and accomplishments of the present invention.

BRIEF DESCRIPTION OF THE INVENTION

FIG. 1 schematically shows the circuit of a conventional charge pump device;

FIG. 3 shows an equivalent circuit of a charge pump device in a positive semi-period of an AC signal according to the first embodiment of the present invention;

FIG. 4 shows an equivalent circuit of a charge pump device in a negative semi-period of an AC signal according to the first embodiment of the present invention;

DETAILED DESCRIPTION OF THE INVENTION

Figure 1:
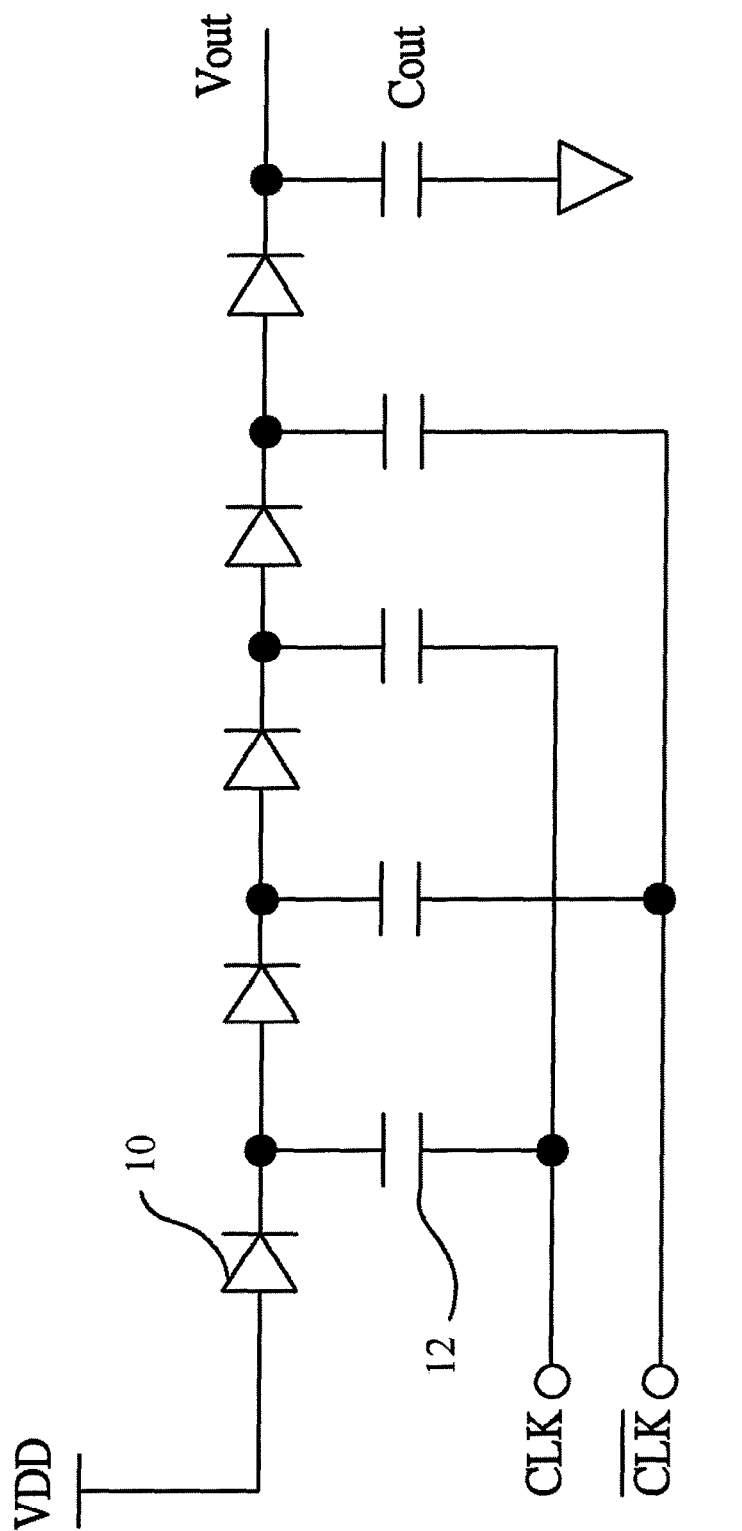
Figure 2:
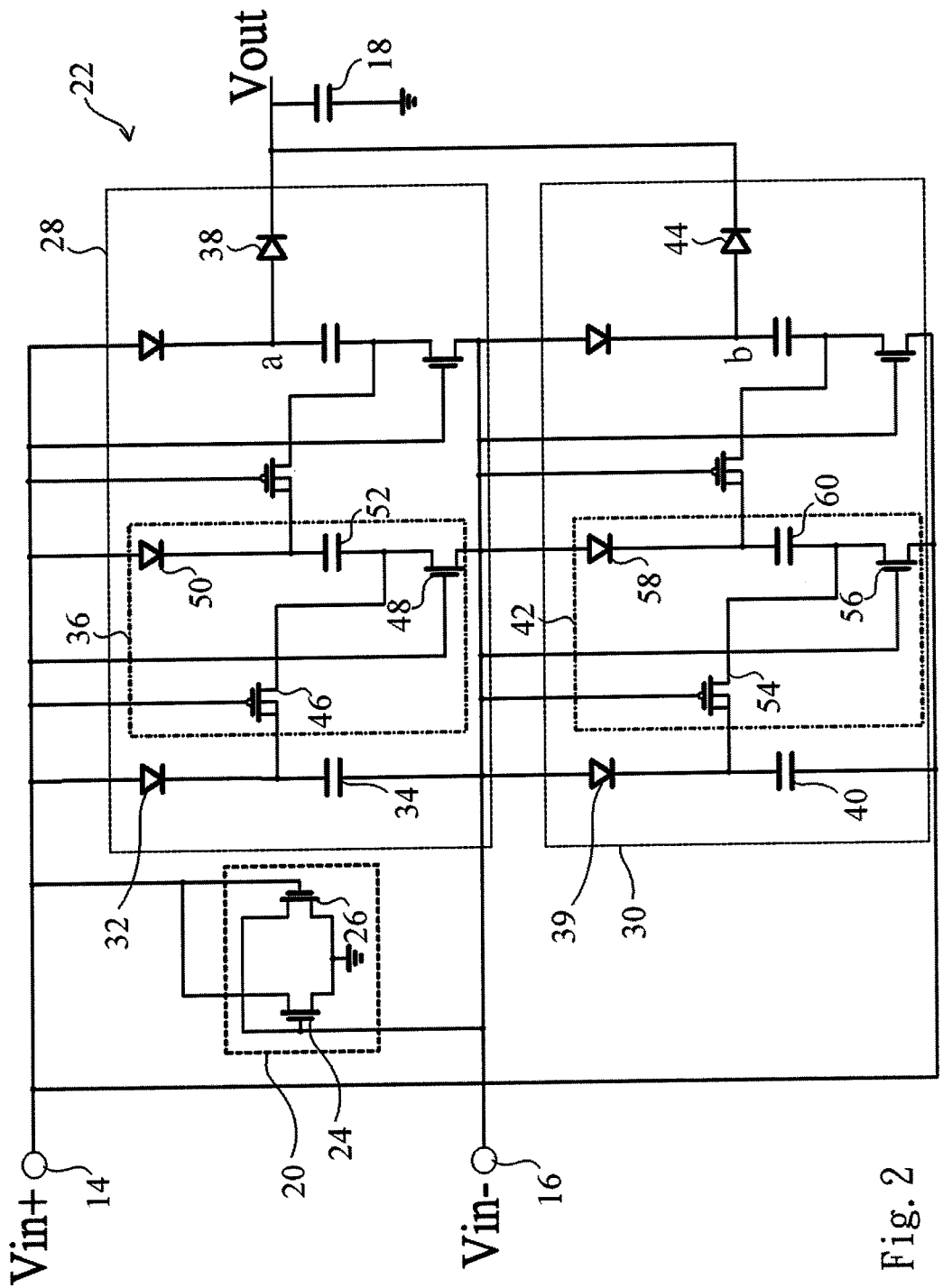
FIG. 2 shows the circuit of a charge pump device according to a first embodiment of the present invention.

Refer to FIG. 2 for a first embodiment of the present invention. The charge pump device of the present invention connects with a first input terminal 14, a second input terminal 16 and a load 18. The first and second input terminals 14 and 16 simultaneously receive an AC signal. The charge pump device of the present invention comprises an electronic switch set 20 and two interconnected voltage boost circuits 22. The electronic switch set 20 connects with the first input terminal 14, the second input terminal 16 and a ground terminal and switches the conduction status thereof according to the AC signal. The two voltage boost circuits 22 connect with the first and second input terminals 14 and 16, the electronic switch set 20 and the load 18. The two voltage boost circuits 22 receive the AC signal according to the conduction status of the electronic switch set 20, respectively boost the voltage of the AC signal in the positive semi-period and the negative semi-period, and alternately output to the load 18 a voltage at least two times the peak voltage of the AC signal.

The electronic switch set 20 includes a first electronic switch 24 and a second electronic switch 26. The first electronic switch 24 connects with the first and second input terminals 14 and 16, the ground terminal and the voltage boost circuits 22, receives the AC signal, and switches to an off state in a positive semi-period and a conductive state in a negative semi-period. In one embodiment, the first electronic switch 24 is a first N-type FET (Field Effect Transistor); the gate thereof connects with the second electronic switch 26, the voltage boost circuits 22 and the second input terminal 16; the drain thereof connects with the voltage boost circuits 22, the second electronic switch 26 and the first input terminal 14; the source thereof connects with the ground terminal. The first N-type FET receives the AC signal and switches to an off state in a positive semi-period and a conductive state in a negative semi-period.

The second electronic switch 26 connects with the first and second input terminals 14 and 16, the ground terminal and the voltage boost circuits 22, receives the AC signal, and switches to a conductive state in a positive semi-period and an off state in a negative semi-period. In one embodiment, the second electronic switch 26 is a second N-type FET; the gate thereof connects with the first electronic switch 24, the voltage boost circuits 22 and the first input terminal 14; the drain thereof connects with the voltage boost circuits 22, the first electronic switch 24 and the second input terminal 16; the source thereof connects with the ground terminal. The second N-type FET receives the AC signal and switches to a conductive state in a positive semi-period and an off state in a negative semi-period.

The two voltage boost circuits 22 include a first voltage boost circuit 28 and a second voltage boost circuit 30. The details thereof are described below.

The first voltage boost circuit 28 has a first backflow prevention element, which is exemplified by a diode 32 in the embodiment shown in FIG. 2. The diode 32 connects with the first and second electronic switches 24 and 26 and the first input terminal 14. The first voltage boost circuit 28 also has a first capacitor 34. The first capacitor 34 has a first electrode connecting with the diode 32 and a second electrode connecting with the second input terminal 16 and the first and second electronic switches 24 and 26. In the positive semi-period of the AC signal, the conduction status of the electronic switch set 20 enables the first capacitor 34 to receive the AC signal via the diode 32, whereby the first capacitor 34 is charged to have the peak voltage. The first electrode and the diode 32 connect with at least one first sub-voltage boost circuit 36. The first sub-voltage boost circuit 36 connects with the first and second input terminals 14 and 16, a positive electrode of the first diode 38, and the first and second electronic switches 24 and 26. The negative electrode of the first diode 38 connects with the load 18. The first sub-voltage boost circuit 36 receives the AC signal according to the conduction status of the electronic switch set 20 and boosts the voltage of the AC signal in the positive semi-period. The first sub-voltage boost circuit 36 cooperates with the first capacitor 34 to supply the load 18 with a voltage at least three times the peak voltage of the AC signal in the negative semi-period via the first diode 38.

The second voltage boost circuit 30 has a second backflow prevention element, which is exemplified by a diode 39 in the embodiment shown in FIG. 2. The diode 39 connects with the first and second electronic switches 24 and 26 and the second input terminal 16. The second voltage boost circuit 30 also has a second capacitor 40. The second capacitor 40 has a third electrode connecting with the diode 39 and a fourth electrode connecting with the first input terminal 14, the first and second electronic switches 24 and 26 and the diode 32. In the negative semi-period of the AC signal, the conduction status of the electronic switch set 20 enables the second capacitor 40 to receive the AC signal via the diode 39, whereby the second capacitor 40 is charged to have the peak voltage. The third electrode and the diode 39 connect with at least one second sub-voltage boost circuit 42. The second sub-voltage boost circuit 42 connects with the first and second input terminals 14 and 16, the first sub-voltage boost circuit 36, a positive electrode of a second diode 44, and the first and second electronic switches 24 and 26. The negative electrode of the second diode 44 connects with the load 18. The second sub-voltage boost circuit 42 receives the AC signal according to the conduction status of the electronic switch set 20 and boosts the voltage of the AC signal in the negative semi-period. The second sub-voltage boost circuit 42 cooperates with the second capacitor 40 to supply the load 18 with a voltage at least three times the peak voltage of the AC signal in the positive semi-period via the second diode 44.

Below are described in details the first and second sub-voltage boost circuits 36 and 42.

The first sub-voltage boost circuit 36 further comprises a third electronic switch 46, a fourth electronic switch 48, a third backflow prevention element and a third capacitor 52. The third electronic switch 46 connects with the first input terminal 14, the first electrode, the diode 32, and the first and second electronic switches 24 and 26. The third electronic switch 46 receives the AC signal and switches the conduction status thereof according to the AC signal. The fourth electronic switch 48 connects with the first and second input terminals 14 and 16 and the first and second electronic switches 24 and 26. The fourth electronic switch 48 receives the AC signal and switches the conduction status thereof according to the AC signal. The third backflow prevention element is exemplified by a diode 50 in the embodiment shown in FIG. 2. The diode 50 connects with the first input terminal 14, the positive electrode of the second diode 38 and the first and second electronic switches 24 and 26. The third capacitor 52 has a fifth electrode and a sixth electrode. The fifth electrode connects with the diode 50 and the positive electrode of the second diode 38. The sixth electrode connects with the third and fourth electronic switches 46 and 48. In the positive semi-period of the AC signal, the third and fourth electronic switches 46 and 48 respectively switch to an off state and a conductive state, and the third capacitor 52 receives the AC signal via the diode 50, whereby the third capacitor 52 is charged to have the peak voltage. In the negative semi-period of the AC signal, the third and fourth electronic switches 46 and 48 respectively switch to a conductive state and an off state. Thus, the third capacitor 52 discharges via the second diode 38 and cooperates with the first capacitor 34 and the AC signal to supply the load 18 with a voltage three times the peak voltage of the AC signal.

The second sub-voltage boost circuit 42 comprises a fifth electronic switch 54, a sixth electronic switch 56, a fourth backflow prevention element and a fourth capacitor 60. The fifth electronic switch 54 connects with the second input terminal 16, the third electrode, the diode 38 and the first and second electronic switches 24 and 26. The fifth electronic switch 54 receives the AC signal and switches the conduction status thereof according to the AC signal. The sixth electronic switch 56 connects with the first and second input terminals 14 and 16 and the first and second electronic switches 24 and 26. The sixth electronic switch 56 receives the AC signal and switches the conduction status thereof according to the AC signal. The fourth backflow prevention element is exemplified by a diode 58 in the embodiment shown in FIG. 2. The diode 58 connects with the second input terminal 16, the positive electrode of the second diode 44, the fourth electronic switch 48 and the first and second electronic switches 24 and 26. The fourth capacitor 60 has a seventh electrode and an eighth electrode. The seventh electrode connects with the diode 58 and the positive electrode of the second diode 44. The eighth electrode connects with the fifth and sixth electronic switches 54 and 56. In the positive semi-period of the AC signal, the fifth and sixth electronic switches 54 and 56 respectively switch to a conductive state and an off state. Meanwhile, the fourth capacitor 60 discharges via the second diode 44 and cooperates with the second capacitor 40 and the AC signal to supply the load 18 with a voltage three times the peak voltage of the AC signal. In the negative period of the AC signal, the fifth and sixth electronic switches 54 and 56 respectively switch to an off state and a conductive state. Meanwhile, the fourth capacitor 60 receives the AC signal via the diode 58 and is charged to have the peak voltage of the AC signal.

In the first embodiment, there are two first second sub-voltage boost circuits 36 and two second sub-voltage boost circuits 42. When there are more than two first sub-voltage boost circuits 36, the first sub-voltage boost circuits 36 are cascaded to each other in an identical way and connected with the first electrode of the first capacitor 34 and the first diode 38. The third electronic switch 46 of one of two adjacent first sub-voltage boost circuits 36 is connected with the fifth electrode of the third capacitor 52 of the other first sub-voltage boost circuit 36. When there are more than two second sub-voltage boost circuits 42, the second sub-voltage boost circuits 42 are cascaded to each other in an identical way and connected with the third electrode of the second capacitor 40 and the second diode 44. The fifth electronic switch 54 of one of two adjacent second sub-voltage boost circuits 42 is connected with the seventh electrode of the fourth capacitor 60 of the other second sub-voltage boost circuit 42.

Below is described the operation of the present invention. Refer to FIG. 2 and FIG. 3. When the voltage of the first input terminal 14 subtracted by the voltage of the second input terminal 16 is a high level voltage, the AC signal is in the positive semi-period. In the positive semi-period, the first, second, third, fourth, fifth and sixth electronic switches 24, 26, 46, 48, 54 and 56 respectively switch to off, conductive, off, conductive, conductive and off states. Thus, the second input terminal 16 is connected with the ground terminal, and the AC signal charges the first and third capacitors 34 and 48 in parallel respectively via the diodes 32 and 50 until the first and third capacitors 34 and 48 have the peak voltage of the AC signal. Meanwhile, the turned-on fifth electronic switch 54 enables the second and fourth capacitors 40 and 60 to discharge in series. The second and fourth capacitors 40 and 60 have the peak voltage obtained at the last cycle. Further, the AC signal also has its own voltage. Therefore, the AC signal together with the second and fourth capacitors 40 and 60 can supply the load 18 with a voltage at least three times the peak voltage of the AC signal.

Refer to FIG. 2 and FIG. 4. When the voltage of the first input terminal 14 subtracted by the voltage of the second input terminal 16 is a low level voltage, the AC signal is in the negative semi-period. In the negative semi-period, the first, second, third, fourth, fifth and sixth electronic switches 24, 26, 46, 48, 54 and 56 respectively switch to conductive, off, conductive, off, off and conductive states. Thus, the first input terminal 14 is connected with the ground terminal, and the AC signal charges the second and fourth capacitors 40 and 60 in parallel respectively via the diodes 39 and 58 until the second and fourth capacitors 40 and 60 have the peak voltage of the AC signal. Meanwhile, the turned-on third electronic switch 46 enables the first and third capacitors 34 and 52 to discharge in series. The first and third capacitors 34 and 52 have the peak voltage obtained at the last cycle. Further, the AC signal also has its own voltage. Therefore, the AC signal together with the first and third capacitors 34 and 52 can supply the load 18 with a voltage at least three times the peak voltage of the AC signal.

If the charge pump device lacks the first and second sub-voltage boost circuits 36 and 42, the first diode 38 will directly connects with the diode 32 and the first capacitor 34, and the second diode 44 will directly connects with the diode 39 and the second capacitor 40. Thus, the charge pump device can only supply the load 18 with a voltage two times the peak voltage of the AC signal.

The present invention is characterized in storing all electric energy in capacitors and using all the capacitors to boost voltage. Thus, the present invention consumes the least power and has the best voltage-boosting efficiency. Further, the present invention needs only an operating signal. Therefore, the present invention not only is exempted from the problem of clock control but also has smaller volume and simpler structure. The present invention simultaneously has rectifying and voltage-boosting functions and thus applies to energy harvester circuits.

From the above description, it is known: if there are totally N pieces of the first capacitors 34 plus the third capacitors 52, the voltage will be boosted (N+1) times. Compared with the conventional charge pump devices, the present invention can boost voltage more times under an identical order. The charge pump device of the present invention does not need signals of opposite-phase clocks but only uses a single signal. The charge pump device of the present invention uses merely two identical voltage boost circuits to alternately and bidirectionally output signals. The charge pump device of the present invention can fast boost voltage within a single cycle. Therefore, the charge pump device of the present invention can effectively shorten the time of reading or writing a flash memory and obviously promote the performance of the flash memory.

Figure 5:
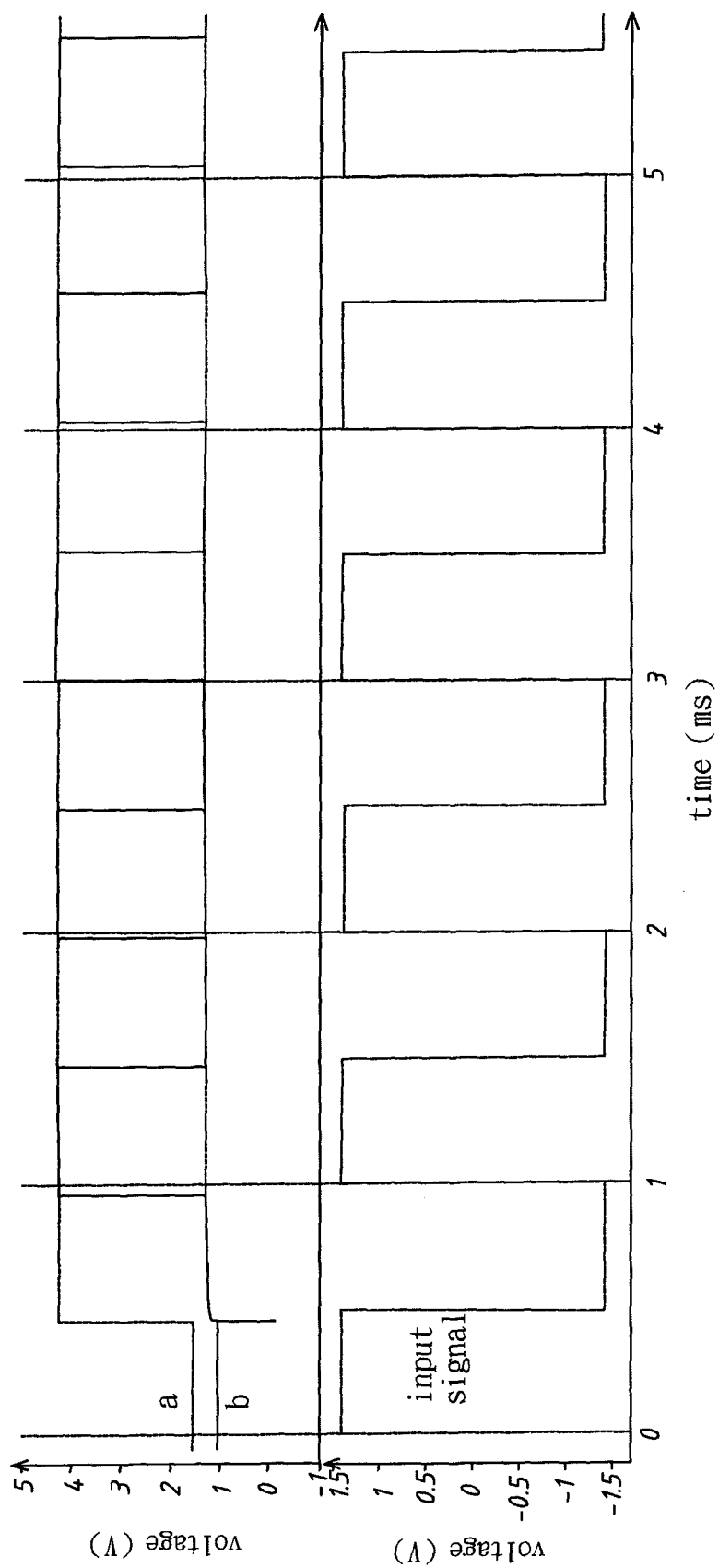
FIG. 5 shows an square-wave signal input to a charge pump device and a signal output by the charge pump device according to the first embodiment of the present invention.

From the above description, it is known: the charge pump device of the present invention can fast boost voltage from zero to the designed value within a single cycle. Refer to FIG. 2 and FIG. 5. The charge pump device of the present invention is verified with a simulation circuit. The input signal is an alternating square-wave signal. The output signals detected at Node a and Node b are also shown in FIG. 5. It is observed: the voltages output at Node a and Node b not only have been boosted but also are complementary to each other. Thus, the voltage ripple is reduced.

Figure 6:
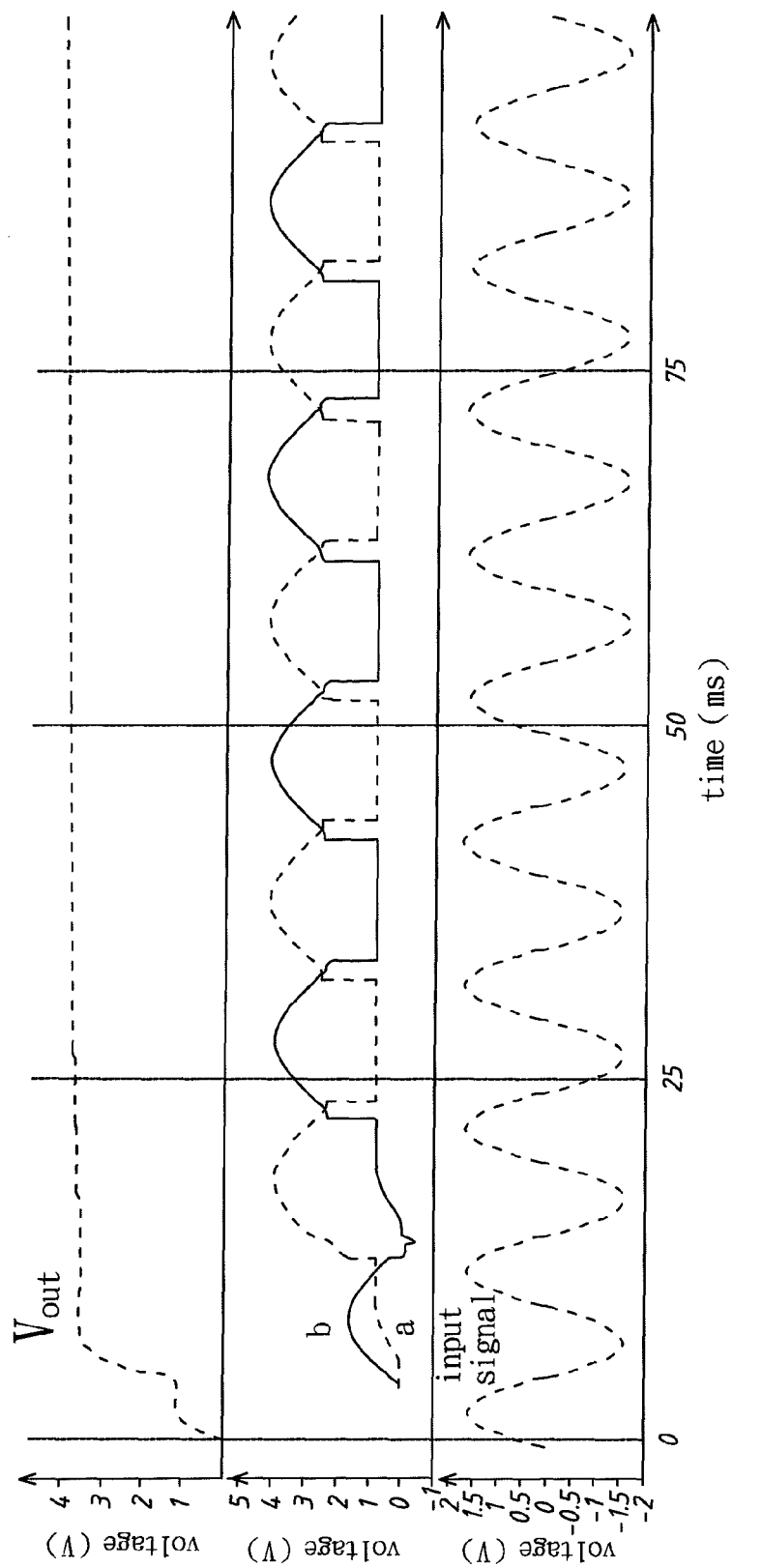
FIG. 6 shows a sinusoidal signal input to a charge pump device and a signal output by the charge pump device according to the first embodiment of the present invention.

As the charge pump device of the present invention simultaneously has rectifying and voltage-boosting functions, it can apply to the energy conversion circuit of a micro-generator to save the components used in a rectifier circuit. Refer to FIG. 2 and FIG. 6. The charge pump device of the present invention is verified with a simulation circuit. The input signal is an alternating sinusoidal signal simulating the output voltage of an AC generator. In FIG. 6 are also shown the signals output at Node a and Node b and the signal output at the load 18 (Vout). From FIG. 6, it is observed: the input signal has been greatly boosted to form Vout. The charge pump device of the present invention can perform an N-order and (N+1) fold voltage boosting. Therefore, the present invention can also function as a charge pump device of an energy conversion circuit or an RFID system, in addition to a fast voltage boost system.

Figure 7:
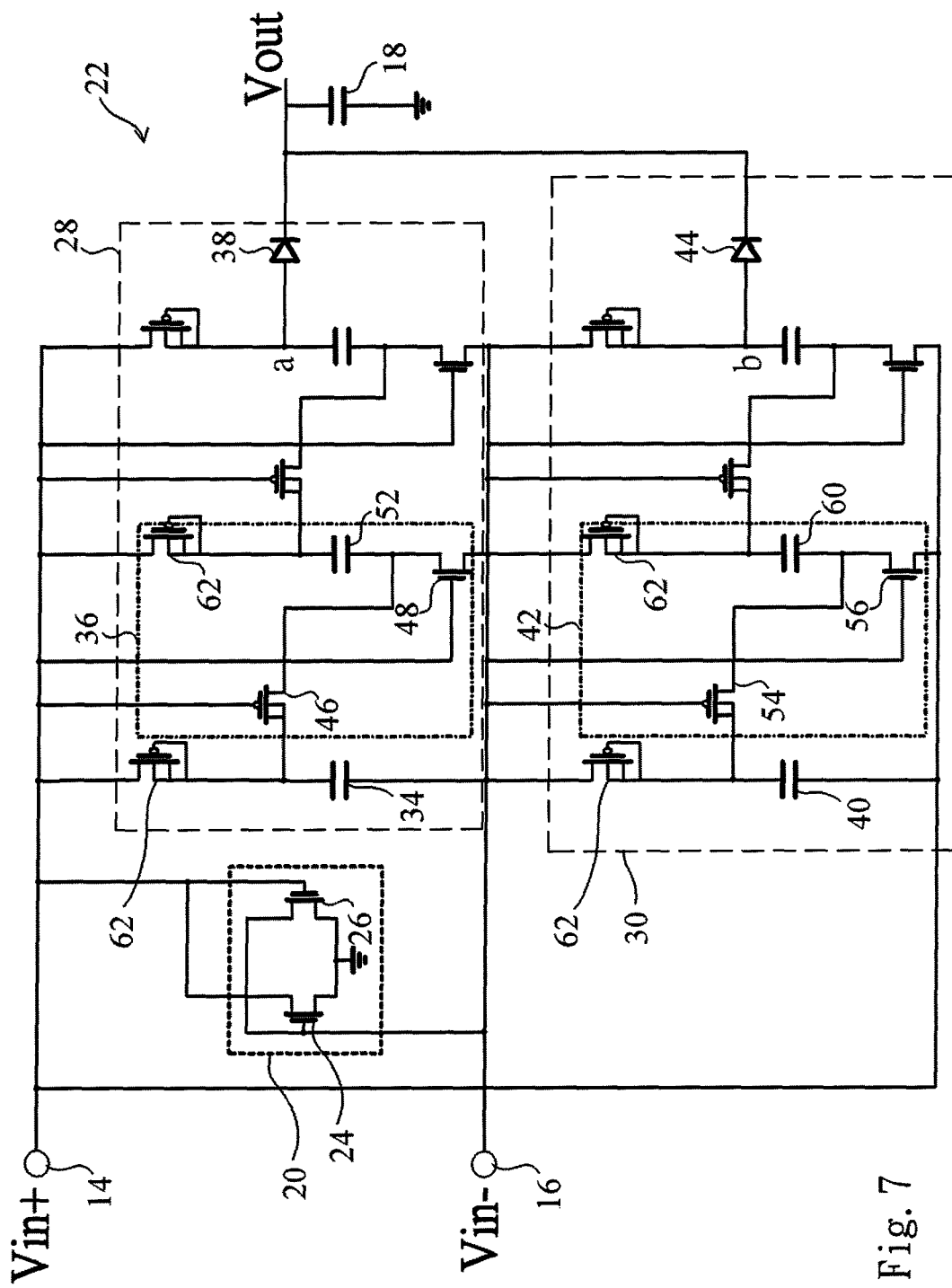
FIG. 7 shows the circuit of a charge pump device according to a second embodiment of the present invention.

In the first embodiment, the first, second, third and fourth backflow prevention elements, which are intended to prevent from backward current leakage and guarantee that the capacitors be charged by the forward current, are realized by the diodes 32, 39, 50 and 58. However, they may also be realized by the P-type FETs with the gate and source thereof connected or the N-type FETs with the gate and drain thereof connected. Refer to FIG. 7 for a second embodiment, wherein the first, second, third and fourth backflow prevention elements are realized by the P-type FETs with the gate and source thereof connected.

The operation of the circuit of the second embodiment is similar to that of the first embodiment and will not repeat herein.

In conclusion, the present invention uses two identical circuits to fast and effectively boost voltage within a single cycle and alternately and bidirectionally output signals with the power consumption thereof reduced. The present invention applies to optoelectronic, communication, consumer-electronic and energy industries.

The embodiments described above are only to exemplify the present invention but not to limit the scope of the present invention. Any equivalent modification or variation according to the spirit or technical contents of the present invention is to be also included within the scope of the present invention.

What is claimed is:

1. A charge pump device, which connects with a first input terminal, a second input terminal and a load, wherein said first input terminal and said second input terminal receive an AC (Alternating Current) signal, and which comprises
an electronic switch set connecting with said first input terminal, said second input terminal and a ground terminal and switching to a conduction status according to said AC signal; and
two voltage boost circuits connecting with each other, connecting with said first input terminal, said second input terminal, said electronic switch set and said load, each receiving said AC signal according to said conduction status, respectively boosting voltage of said AC signal in a positive semi-period and a negative semi-period of said AC signal, and alternately supplying said load with a voltage at least two times a peak voltage of said AC signal
said electronic switch further comprises
a first electronic switch connecting with said first input terminal, said second input terminal, said ground terminal and said voltage boost circuits, receiving said AC signal, and respectively switching to an off state and a conductive state in said positive semi-period and said negative semi-period; and
a second electronic switch connecting with said first input terminal, said second input terminal, said ground terminal and said voltage boost circuits, receiving said AC signal, and respectively switching to a conductive state and an off state in said positive semi-period and said negative semi-period.

2. The charge pump device according to claim 1, wherein said first electronic switch is a first N-type FET (Field-Effect Transistor), and wherein a gate of said first N-type FET connects with said second electronic switch, said voltage boost circuits and said second input terminal, and wherein a drain of said first N-type FET connects with said voltage boost circuits, said second electronic switch and said first input terminal, and wherein a source of said first N-type FET connects with said ground terminal, and wherein said first N-type FET receives said AC signal and respectively switches to an off state and a conductive state in said positive semi-period and said negative semi-period.

3. The charge pump device according to claim 1, wherein said second electronic switch is a second N-type FET (Field-Effect Transistor), and wherein a gate of said second N-type FET connects with said first electronic switch, said voltage boost circuits and said first input terminal, and wherein a drain of said second N-type FET connects with said voltage boost circuits, said first electronic switch and said second input terminal, and wherein a source of said second N-type FET connects with said ground terminal, and wherein said second N-type FET receives said AC signal and respectively switches to a conductive state and an off state in said positive semi-period and said negative semi-period.

4. The charge pump device according to claim 1, wherein said voltage boost circuits include a first voltage boost circuit and a second voltage boost circuit, and
wherein said first voltage boost circuit further comprises
a first backflow prevention element connecting with said electronic switch set and said first input terminal;
a first capacitor having a first electrode and a second electrode, receiving said AC signal via said first backflow prevention element according to said conduction status in said positive semi-period, and charged to have said peak voltage in said positive semi-period, wherein said first electrode connects with said first backflow prevention element, and wherein said second electrode connects with said second input terminal and said electronic switch set; and a first diode having a positive electrode and a negative electrode, wherein said positive electrode connects with said first electrode, and wherein said negative electrode connects with said load, and wherein said first capacitor discharges via said first diode and cooperates with said AC signal to supply said load with a voltage two times said peak voltage in said negative semi-period; and
wherein said second voltage boost circuit further comprises
a second backflow prevention element connecting with said electronic switch set, said second electrode and said second input terminal;
a second capacitor having a third electrode and a fourth electrode, receiving said AC signal via said second backflow prevention element according to said conduction status in said negative semi-period, and charged to have said peak voltage in said negative semi-period, wherein said third electrode connects with said second backflow prevention element, and wherein said fourth electrode connects with said first input terminal, said electronic switch set and said first backflow prevention element; and
a second diode having a positive electrode and a negative electrode, wherein said positive electrode connects with said third electrode, and wherein said negative electrode connects with said load, and wherein said second capacitor discharges via said second diode and cooperates with said AC signal to supply said load with a voltage two times said peak voltage in said positive semi-period.

5. The charge pump device according to claim 4, wherein each of said first backflow prevention element and said second backflow prevention element is a diode, a P-type FET (Field-Effect Transistor) with a gate thereof connecting with a source thereof, or an N-type FET with a gate thereof connecting with a drain thereof.

6. The charge pump device according to claim 4,
wherein said first voltage boost circuit further comprises at least one first sub-voltage boost circuit connecting with said first electrode, said first backflow prevention element, said first input terminal, said second input terminal, said first diode and said electronic switch set, receiving said AC signal according to said conduction status, boosting voltage of said AC signal in said positive semi-period, and cooperating with said first capacitor to supply said load with a voltage at least three times said peak voltage via said first diode in said negative semi-period; and
wherein said second voltage boost circuit further comprises at least one second sub-voltage boost circuit connecting with said third electrode, said second backflow prevention element, said first input terminal, said second input terminal, said first sub-voltage boost circuit, said second diode and said electronic switch set, receiving said AC signal according to said conduction status, boosting voltage of said AC signal in said negative semi-period, and cooperating with said second capacitor to supply said load with a voltage at least three times said peak voltage via said second diode in said positive semi-period.

7. The charge pump device according to claim 6,
wherein said first sub-voltage boost circuit further comprises
a third electronic switch connecting with said first input terminal, said first electrode, said first backflow prevention element and said electronic switch set, receiving said AC signal, and switching a conduction status thereof according to said AC signal;

a fourth electronic switch connecting with said first input terminal, said second input terminal and said electronic switch set, receiving said AC signal, and switching a conduction status thereof according to said AC signal;

a third backflow prevention element connecting said first input terminal, said positive electrode of said first diode and said electronic switch set; and a third capacitor having a fifth electrode and a sixth electrode, wherein said fifth electrode connects with said third backflow prevention element and said positive electrode of said first diode, and wherein said sixth electrode connects with said third electronic switch and said fourth electronic switch, and wherein according to said third electronic switch and said fourth electronic switch, said third capacitor is charged to have said peak voltage via receiving said AC signal from said third backflow prevention element, or discharges via said first diode and cooperates with said first capacitor and said AC signal to supply said load with a voltage three times said peak value; and wherein said second sub-voltage boost circuit further comprises a fifth electronic switch connecting with said second input terminal, said third electrode, said second backflow prevention element and said electronic switch set, receiving said AC signal, and switching a conduction status thereof according to said AC signal;

a sixth electronic switch connecting with said first input terminal, said second input terminal and said electronic switch set, receiving said AC signal, and switching a conduction status thereof according to said AC signal;

a fourth backflow prevention element connecting said second input terminal, said positive electrode of said second diode, said fourth electronic switch and said electronic switch set; and a fourth capacitor having a seventh electrode and an eighth electrode, wherein said seventh electrode connects with said fourth backflow prevention element and said positive electrode of said second diode, and wherein said eighth electrode connects with said fifth electronic switch and said sixth electronic switch, and Wherein according to said fifth electronic switch and said sixth electronic switch, said fourth capacitor is charged to have said peak voltage via receiving said AC signal from said fourth backflow prevention element, or discharges via said second diode and cooperates with said second capacitor and said AC signal to supply said load with a voltage three times said peak value.

8. The charge pump device according to claim 7, wherein said third electronic switch and said fourth electronic switch respectively switch to a off state and a conductive state in said positive semi-period, and wherein said third capacitor receives said AC signal via said third backflow prevention element and is charged to have said peak voltage in said positive semi-period, and wherein said fifth electronic switch and said sixth electronic switch respectively switch to a conductive state and a off state in said positive semi-period, and wherein said fourth capacitor discharges via said second diode and cooperates with said second capacitor and said AC signal to supply said load with a voltage three times said peak voltage in said positive semi-period.

9. The charge pump device according to claim 7, wherein said third electronic switch and said fourth electronic switch respectively switch to a conductive state and a off state in said negative semi-period, and wherein said third capacitor discharges via said first diode and cooperates with said first capacitor and said AC signal to supply said load with a voltage three times said peak voltage in said negative semi-period, and Wherein said fifth electronic and said sixth electronic respectively switch to a off state and a conductive state in said negative semi-period, and wherein said fourth capacitor receives said AC signal via said fourth backflow prevention element and is charged to have said peak voltage in said negative semi-period.

10. The charge pump device according to claim 7,
wherein there are two or more than two said first sub-voltage boost circuits, and wherein said first sub-voltage boost circuits are cascaded to each other in an identical way and connected with said first electrode and said first diode, and wherein said third electronic switch of one of two adjacent said first sub-voltage boost circuits is connected with said fifth electrode of the other said first sub-voltage boost circuit, and wherein there are more than two said second sub-voltage boost circuits, and wherein said second sub-voltage boost circuits are cascaded to each other in an identical way and connected with said third electrode and said second diode, and wherein said fifth electronic switch of one of two adjacent said second sub-voltage boost circuits is connected with said seventh electrode of the other said second sub-voltage boost circuit.

11. The charge pump device according to claim 7, wherein each of said third backflow prevention element and said fourth backflow prevention element is a diode, a P-type FET (Field-Effect Transistor) with a gate thereof connecting with a source thereof, or an N-type FET with a gate thereof connecting with a drain thereof.

* * * * *